United States Patent
Yamada

(10) Patent No.: US 8,779,377 B2
(45) Date of Patent: Jul. 15, 2014

(54) IMAGE PICKUP UNIT AND IMAGE PICKUP DISPLAY SYSTEM

(71) Applicant: Sony Corporation, Tokyo (JP)

(72) Inventor: Yasuhiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/870,153

(22) Filed: Apr. 25, 2013

(65) Prior Publication Data

US 2013/0334436 A1 Dec. 19, 2013

(30) Foreign Application Priority Data

Jun. 13, 2012 (JP) .................................. 2012-133858

(51) Int. Cl.
*G01J 1/42* (2006.01)
*H04N 5/32* (2006.01)

(52) U.S. Cl.
CPC ........................................ *H04N 5/32* (2013.01)
USPC ........................................................... 250/394

(58) Field of Classification Search
CPC ......... H04N 5/32; H04N 5/378; H04N 3/155; H01L 27/14643; G01T 1/2928
USPC ........................................................ 250/394
See application file for complete search history.

(56) References Cited

U.S. PATENT DOCUMENTS

| | | | | |
|---|---|---|---|---|
| 5,981,931 A | * | 11/1999 | Kinno et al. | 250/208.1 |
| 7,608,832 B2 | * | 10/2009 | Okada | 250/370.08 |
| 7,655,917 B2 | * | 2/2010 | Iwakiri | 250/370.09 |
| 7,902,512 B1 | * | 3/2011 | Chang et al. | 250/370.01 |
| 8,023,025 B2 | * | 9/2011 | Itano et al. | 348/308 |
| 2001/0038076 A1 | * | 11/2001 | Kuwabara | 250/370.11 |
| 2002/0017666 A1 | * | 2/2002 | Ishii et al. | 257/291 |
| 2005/0202609 A1 | * | 9/2005 | Zhang et al. | 438/164 |
| 2011/0147596 A1 | * | 6/2011 | Ishida et al. | 250/366 |

FOREIGN PATENT DOCUMENTS

| | | |
|---|---|---|
| JP | 2008-277710 | 11/2008 |
| JP | 2011-014752 | 1/2011 |

* cited by examiner

*Primary Examiner* — Kiho Kim
(74) *Attorney, Agent, or Firm* — Dentons US LLP

(57) ABSTRACT

An image pickup unit includes: a plurality of pixels each including a photoelectric conversion device and a field-effect transistor; and a readout control line and a signal line that are disposed in a peripheral region of the photoelectric conversion device and are connected to the transistor. The readout control line includes a first wiring layer and a second wiring layer that are laminated and are electrically connected to each other. The first wiring layer is electrically connected to a gate electrode of the transistor, and the second wiring layer is provided in a same layer as the signal line.

11 Claims, 16 Drawing Sheets

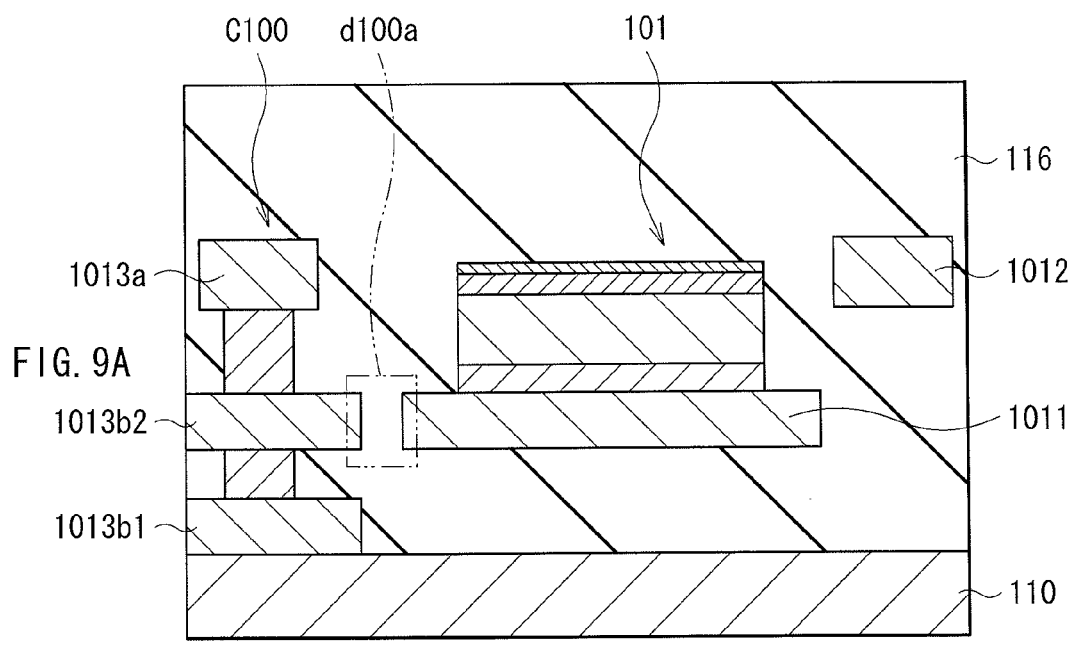
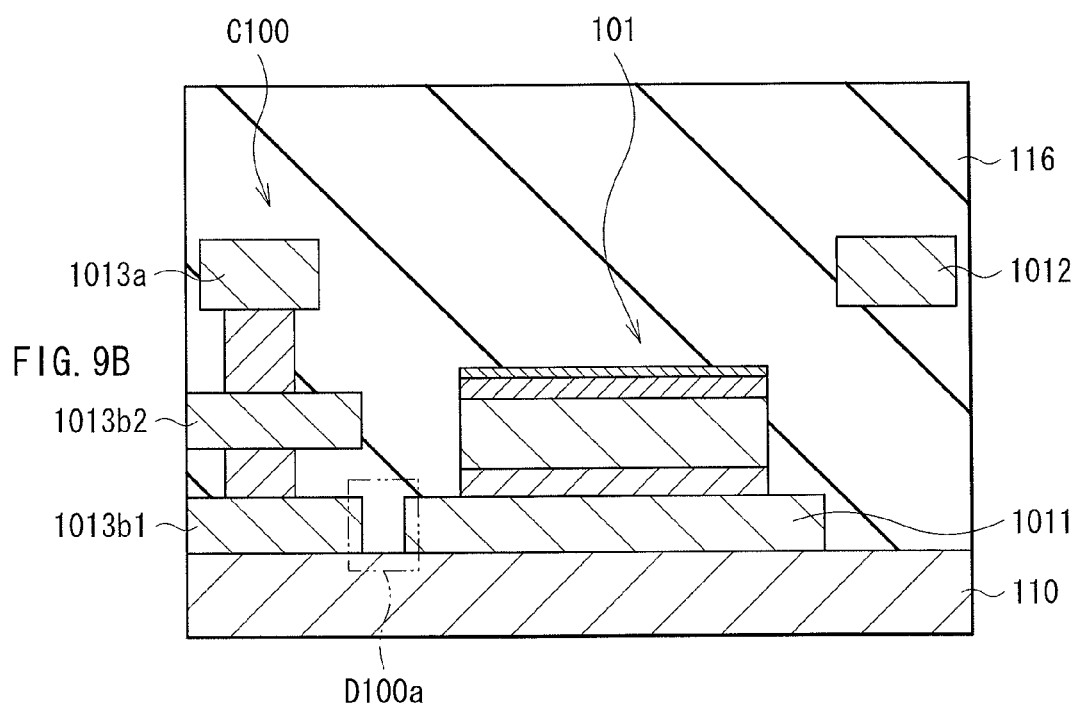

IMAGE PICKUP UNIT AND IMAGE PICKUP DISPLAY SYSTEM

BACKGROUND

The disclosure relates to an image pickup unit suitable for X-ray radiography, for example, and an image pickup display system using such an image pickup unit.

In recent years, an image pickup unit, which obtains an image based on a radiation ray as an electric signal without intervention of a radiographic film, has been developed for X-ray image-pickup units in medical applications, nondestructive inspection uses, etc. In such an image pickup unit, a photoelectric conversion device and a field effect thin-film transistor (TFT) are disposed for each pixel. Signal charge stored in the pixel is extracted using a pixel circuit including the transistor, and thereby an electric signal based on the amount of radiation is obtained.

As the photoelectric conversion device used for such an image pickup unit, a Positive Intrinsic Negative (PIN) photodiode, for example, may be used. The PIN photodiode has a structure in which a so-called i-type semiconductor layer (an intrinsic semiconductor layer) is interposed between a p-type semiconductor layer and an n-type semiconductor layer. This PIN photodiode is capable of extracting signal charge in an amount corresponding to a quantity of incident light (see, for instance, Japanese Unexamined Patent Application Publication Nos. 2008-277710 and 2011-14752).

SUMMARY

In a medical X-ray image-pickup unit used in, for example, contrast radiography for coronary vein etc., among the radiation image-pickup units described above, it is necessary to take a moving image at a high speed. However, in a large-sized image-taking unit, in particular, a readout control line (a scanning line) is formed to be long, resulting in an increase in time constant of wiring and an increase in readout time, which are disadvantageous.

It is desirable to provide an image pickup unit capable of taking a moving image at a high speed, and an image pickup display system with such an image pickup unit.

According to an embodiment of the disclosure, there is provided an image pickup unit including: a plurality of pixels each including a photoelectric conversion device and a field-effect transistor; and a readout control line and a signal line that are disposed at a periphery of the photoelectric conversion device and are connected to the transistor. The readout control line includes a first wiring layer and a second wiring layer that are laminated and are electrically connected to each other. The first wiring layer is electrically connected to a gate electrode of the transistor, and the second wiring layer is provided in a same layer as the signal line.

According to an embodiment of the disclosure, there is provided an image pickup display system with an image pickup unit and a display unit that performs image display based on an image pickup signal obtained by the image pickup unit. The image pickup unit includes: a plurality of pixels each including a photoelectric conversion device and a field-effect transistor; and a readout control line and a signal line that are at a periphery of the photoelectric conversion device and are connected to the transistor. The readout control line includes a first wiring layer and a second wiring layer that are laminated and are electrically connected to each other. The first wiring layer is electrically connected to a gate electrode of the transistor, and the second wiring layer is provided in a same layer as the signal line.

In the image pickup unit and the image pickup display system according to the above-described embodiments of the disclosure, the first wiring layer and the second wiring layer are laminated in the readout control line at a periphery of the photoelectric conversion device. The first wiring layer is electrically connected to the gate electrode of the transistor, and the second wiring layer is provided in the same layer as the signal line. As compared with a case where a readout control line is formed as a single layer, wiring resistance is lowered and a time constant is reduced.

According to the image pickup unit and the image pickup display system of the above-described embodiments of the disclosure, the first wiring layer and the second wiring layer are laminated in a state of being electrically connected, in the readout control line at a periphery of the photoelectric conversion device. The first wiring layer is electrically connected to the gate electrode of the transistor, and the second wiring layer is provided in the same layer as the signal line. This makes it possible to reduce the time constant of wiring, and to shorten the readout time. Therefore, it is possible to take a moving image at a high speed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to describe the principles of the technology.

FIGS. 9A and 9B are cross-sectional diagrams of a pixel according to another comparative example.

DETAILED DESCRIPTION

An embodiment of the disclosure will be described below in detail with reference to the drawings. It is to be noted that the description will be provided in the following order.
1. Embodiment (an example of an image pickup unit in which a lower electrode of a photoelectric conversion device is provided in the same layer as a first gate electrode of a transistor)
2. Modification 1 (an example in which a lower electrode is provided in the same layer as a second gate electrode)
3. Modification 2 (an example in which a lower electrode is provided in a layer higher than a signal line)
4. Modification 3 (an example in which a lower electrode is not provided (i.e. a low-temperature polysilicon is used for an n-type semiconductor layer))
5. Modifications 4-1 and 4-2 (other examples of a passive pixel circuit)
6. Modifications 5-1 and 5-2 (other examples of an active pixel circuit)
7. Modification 6 (an example of an indirect-conversion-type image pickup unit)
8. Modification 7 (an example of a direct-conversion-type image pickup unit)
9. Application example (an example of an image pickup display system)

Embodiment

Configuration

Figure 1:
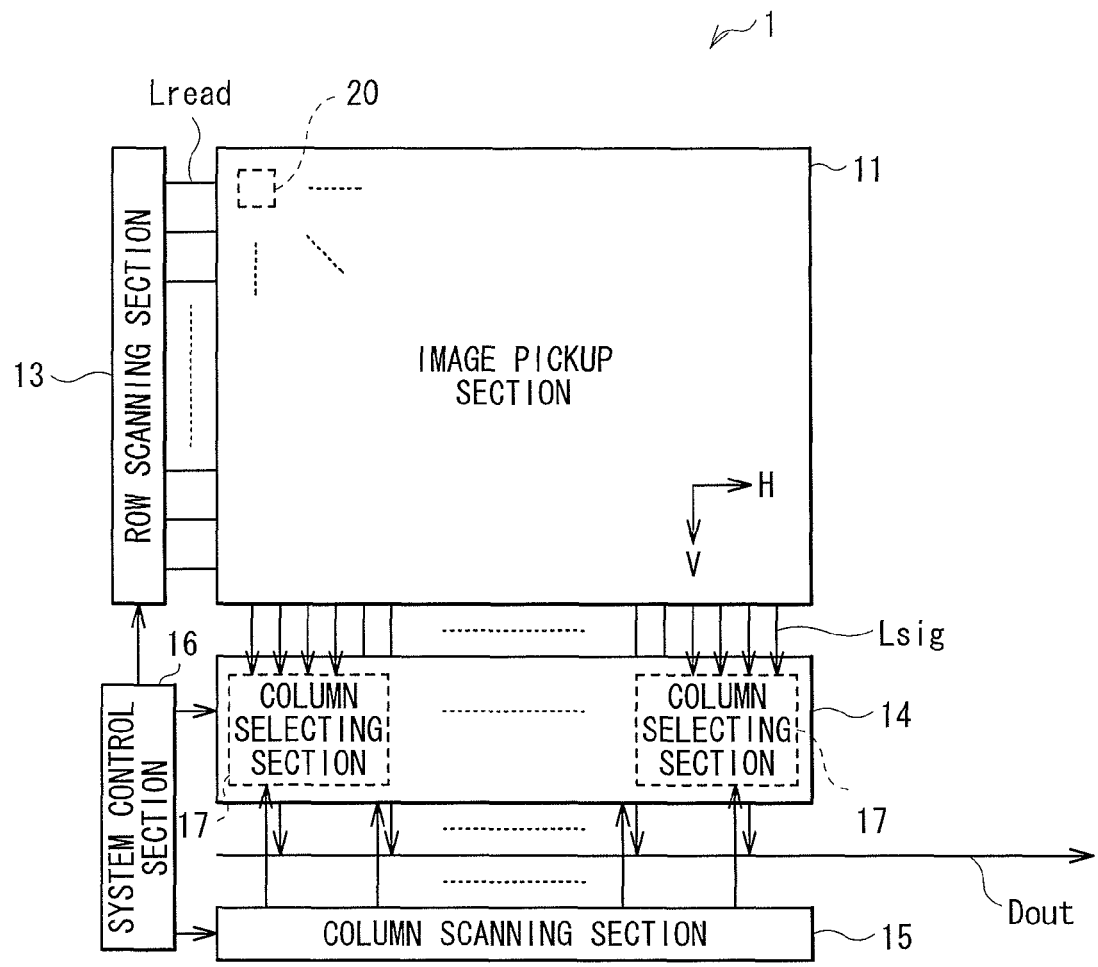
FIG. 1 is a block diagram illustrating an overall configuration example of an image pickup unit according to an embodiment of the disclosure.

FIG. 1 illustrates an overall block configuration of an image pickup unit (an image pickup unit 1) according to an embodiment of the disclosure. The image pickup unit 1 reads information about (picks up an image of) a subject based on incident light (image pickup light). The image pickup unit 1 may include an image pickup section 11, a row scanning section 13, an A/D conversion section 14, a column scanning section 15, and a system control section 16, for example.
(Image Pickup Section 11)

The image pickup section 11 generates an electric signal in response to incident light (image pickup light). In this image pickup section 11, pixels (image pickup pixels, unit pixels) 20 are arranged two-dimensionally in rows and columns (in a matrix). Each of the pixels 20 includes a photoelectric conversion device (a photoelectric conversion device 21 described later). The photoelectric conversion device generates photocharge in an amount corresponding to a quantity of the incident light, and stores the photocharge inside thereof. It is to be noted that as illustrated in FIG. 1, the description will be provided below by referring to a horizontal direction (a row direction) in the image pickup section 11 as an "H" direction and a vertical direction (a column direction) as a "V" direction.

Figure 2:
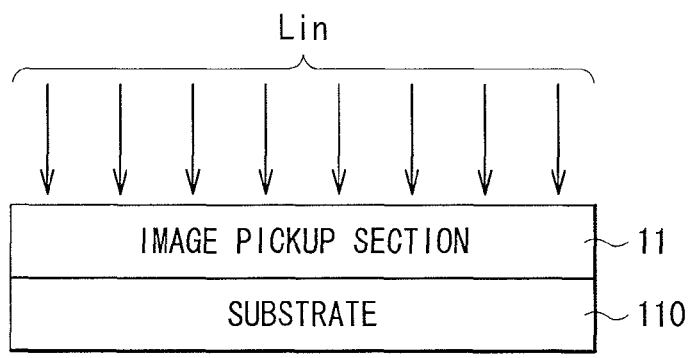
FIG. 2 is a schematic diagram illustrating a schematic configuration example of an image pickup section depicted in FIG. 1.

This image pickup section 11 may be provided, for example, on a substrate 110, and includes the photoelectric conversion device 21 and a field effect transistor 22 for each of the pixels 20 as illustrated in FIG. 2. It is to be noted that, for example, a wavelength conversion layer described later may be provided on a top surface of the image pickup section 11 or a back side of the substrate 110, and the image pickup unit 1 may be used as, for example, a so-called radiation image-pickup unit of an indirect conversion type.

Figure 3:
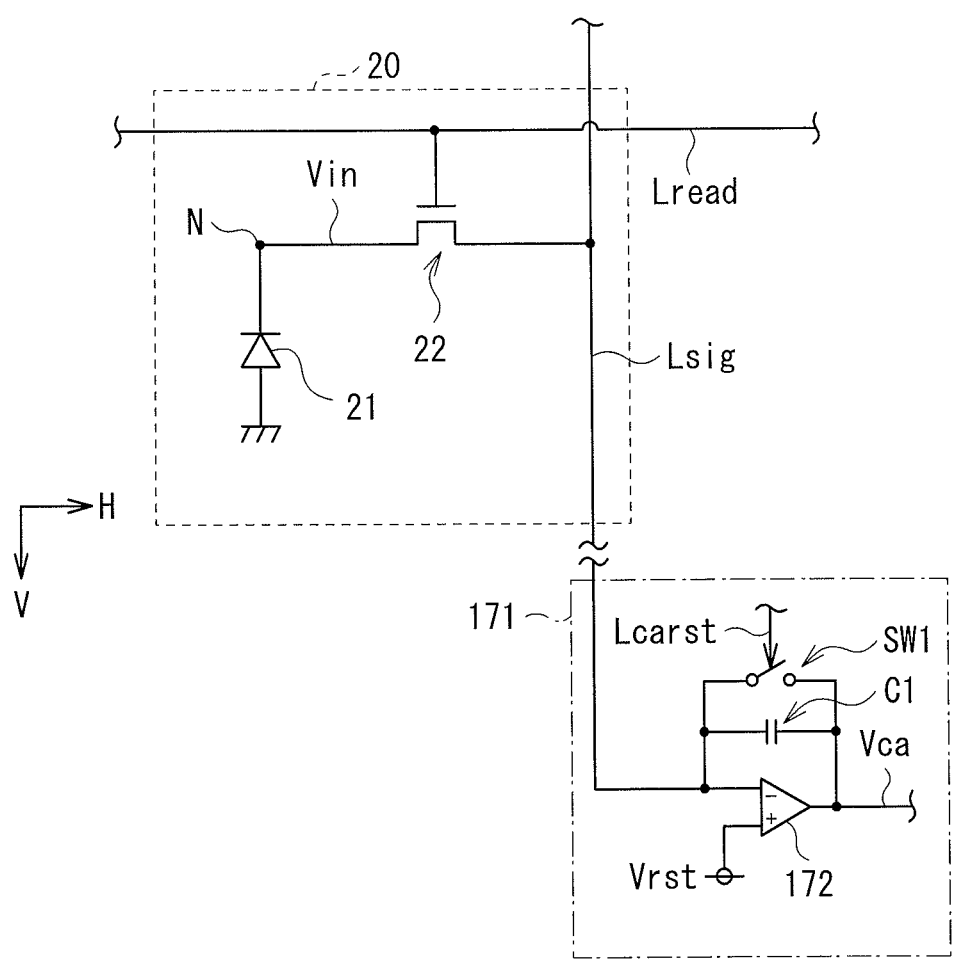
FIG. 3 is a circuit diagram illustrating a detailed configuration example of a pixel etc. depicted in FIG. 1.

FIG. 3 illustrates an example of a circuit configuration (a so-called passive circuit configuration) of the pixel 20, together with a circuit configuration of a charge amplifier circuit 171 described later in the A/D conversion section 14. This passive pixel 20 is provided with the one photoelectric conversion device 21 and the one transistor 22. Further, a readout control line Lread (such as gate line and scanning line) extending along the H direction and a signal line Lsig extending along the V direction are connected to this pixel 20. As will be described later in detail, the readout control line Lread has a structure (a shunt structure) in which a plurality of wiring layers are electrically connected and laminated.

The photoelectric conversion device 21 may be, for example, a Positive Intrinsic Negative (PIN) photodiode or a Metal-Insulator-Semiconductor (MIS) sensor. As mentioned above, the photoelectric conversion device 21 generates the signal charge in an amount corresponding to the quantity of the incident light (the image pickup light Lin). It is to be noted that, here, a cathode of this photoelectric conversion device 21 is connected to a storage node N.

The transistor 22 is a transistor (a readout transistor) that outputs signal charge (an input voltage Vin) obtained by the photoelectric conversion device 21 to the signal line Lsig, by entering an ON state in response to a row scanning signal supplied through the readout control line Lread. Here, the transistor 22 is configured using an N-channel-type (N-type) Field Effect Transistor (FET). Alternatively, the transistor 22 may be configured using a P-channel-type (P-type) FET, etc. In the circuit configuration of the pixel 20, a gate of the transistor 22 is connected to the readout control line Lread, a source (or a drain) may be connected to, for example, the signal line Lsig, and the drain (or the source) may be connected to, for example, the cathode of the photoelectric conversion device 21 through the storage node N. In addition, here, an anode of the photoelectric conversion device 21 is connected to the ground (grounded).

Here, the transistor 22 has three terminals of the gate (a gate electrode), the source (a source electrode), and the drain (a drain electrode) as described above. The transistor 22 may have, for example, a so-called dual-gate structure (not illustrated) in which, for the gate electrode among the above-mentioned terminals, two gate electrodes are provided with a semiconductor layer (an active layer) interposed therebetween. However, the transistor 22 is not limited to this dual-gate structure, and may have a structure in which one gate electrode is provided for a semiconductor layer (i.e. a single-gate structure). In addition, in the case of the single-gate structure, the transistor 22 may have a so-called bottom-gate structure or top-gate structure.

The row scanning section 13 may include, for example, a predetermined shift register circuit, a logical circuit, etc. The row scanning section 13 is a pixel driving section (a row scanning circuit) that performs driving of the pixels 20 row by row (for each of horizontal lines) in the image pickup section 11 (i.e. line-sequential scanning). Specifically, the row scanning section 13 may perform image pickup operation such as reading operation, by, for example, line-sequential scanning. It is to be noted that this line-sequential scanning is performed by supplying the above-described row scanning signal to each of the pixels 20 (specifically, the transistor 22) through the readout control line Lread.

The A/D conversion section 14 includes a plurality of column selecting sections 17 each being provided for every plurality of (here, four) signal lines Lsig. The A/D conversion section 14 performs A/D conversion (analog to digital conversion) based on a signal voltage (signal charge) inputted through the signal line Lsig. Thus, output data Dout formed of digital signals (i.e. image pickup signals) is generated, and outputted to the outside.

Each of the column selecting sections 17 may have, for example, the charge amplifier circuit 171 (FIG. 3) that may include a charge amplifier 172, a capacitive device (a capacitor, or a feedback capacitive device) C1, and a switch SW1. Each of the column selecting sections 17 further has a sample hold (S/H) circuit, a multiplexor circuit (a selection circuit), and an A/D converter which are not illustrated.

The charge amplifier 172 is an amplifier that converts signal charge read out from the signal line Lsig, into a voltage (i.e. performs Q-V conversion). In this charge amplifier 172, one end of the signal line Lsig is connected to an input terminal on a negative side (a minus side), and a predetermined reset voltage Vrst is inputted into an input terminal on a positive side (a plus side). Between an output terminal of the charge amplifier 172 and the input terminal on the negative side of the charge amplifier 172, feedback connection is established through a parallel connection circuit including the capacitive device C1 and the switch SW1. In other words, one terminal of the capacitive device C1 is connected to the input terminal on the negative side of the charge amplifier 172, and the other terminal of the capacitive device C1 is connected to the output terminal of the charge amplifier 172. Similarly, one terminal of the switch SW1 is connected to the input terminal on the negative side of the charge amplifier 172, and the other terminal of the switch SW1 is connected to the output terminal of the charge amplifier 172. It is to be noted that the ON/OFF state of this switch SW1 is controlled by a control signal (an amplifier reset control signal) supplied from the system control section 16 through an amplifier reset control line Lcarst.

The column scanning section 15 may include, for example, a shift register, an address decoder, etc., which are not illustrated. The column scanning section 15 sequentially drives each of the column selecting sections 17. Through selection scanning performed by this column scanning section 15, the signal (the above-described output data Dout) of each of the pixels 20 read out through each of the signal lines Lsig is sequentially outputted to the outside.

The system control section 16 controls operation of each of the row scanning section 13, the A/D conversion section 14, and the column scanning section 15. Specifically, the system control section 16 includes a timing generator generating various timing signals (control signals), and controls driving of the row scanning section 13, the A/D conversion section 14, and the column scanning section 15, based on these various timing signals generated by the timing generator. Based on this control of the system control section 16, each of the row scanning section 13, the A/D conversion section 14, and the column scanning section 15 performs image pickup driving (line-sequential image pickup driving) for each of the pixels 20. The output data Dout is thereby acquired from the image pickup section 11.

(Detailed Configuration of Pixel 20)

Figure 4:
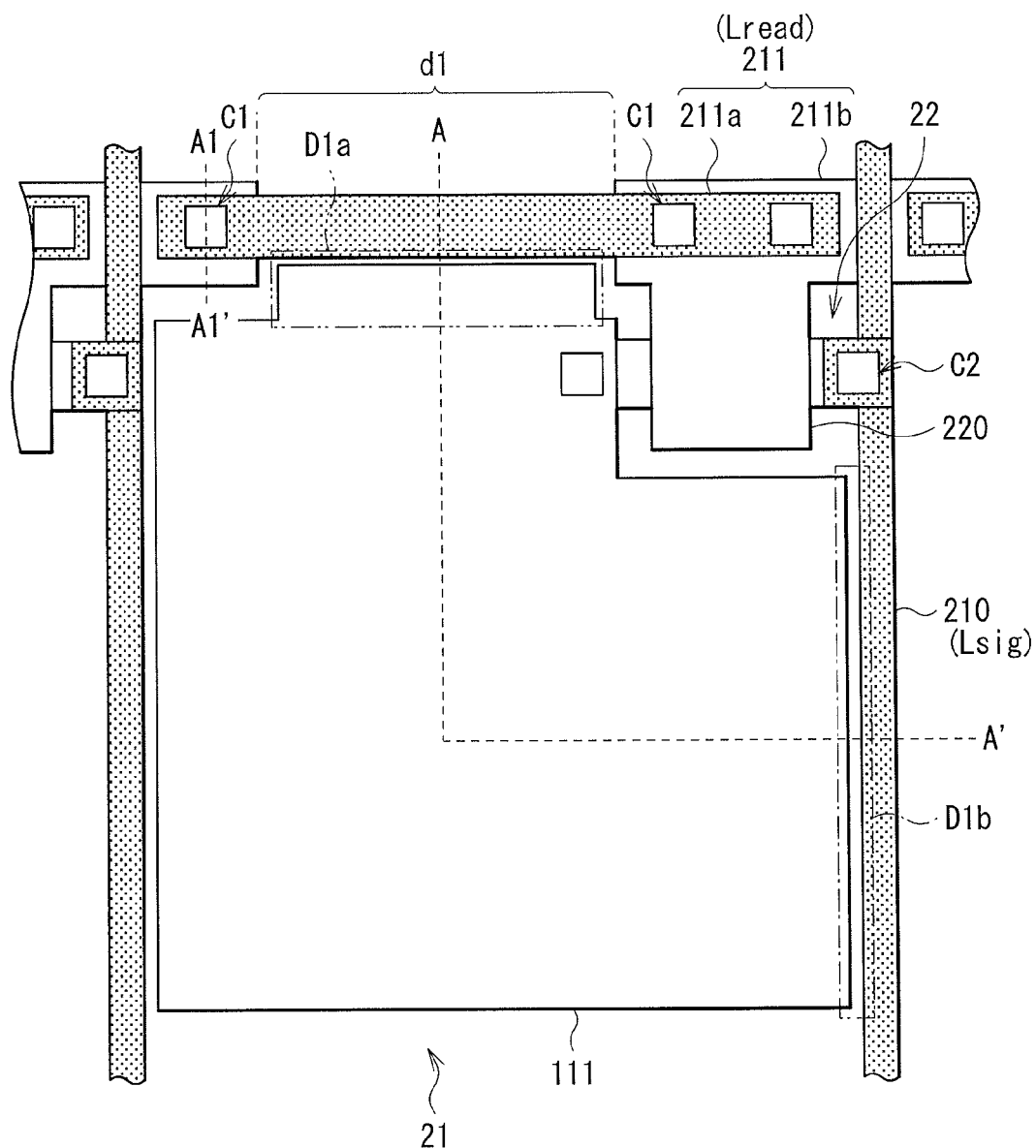
FIG. 4 is a schematic diagram illustrating a plane configuration example of a main part of the pixel depicted in FIG. 1.
Figure 5:
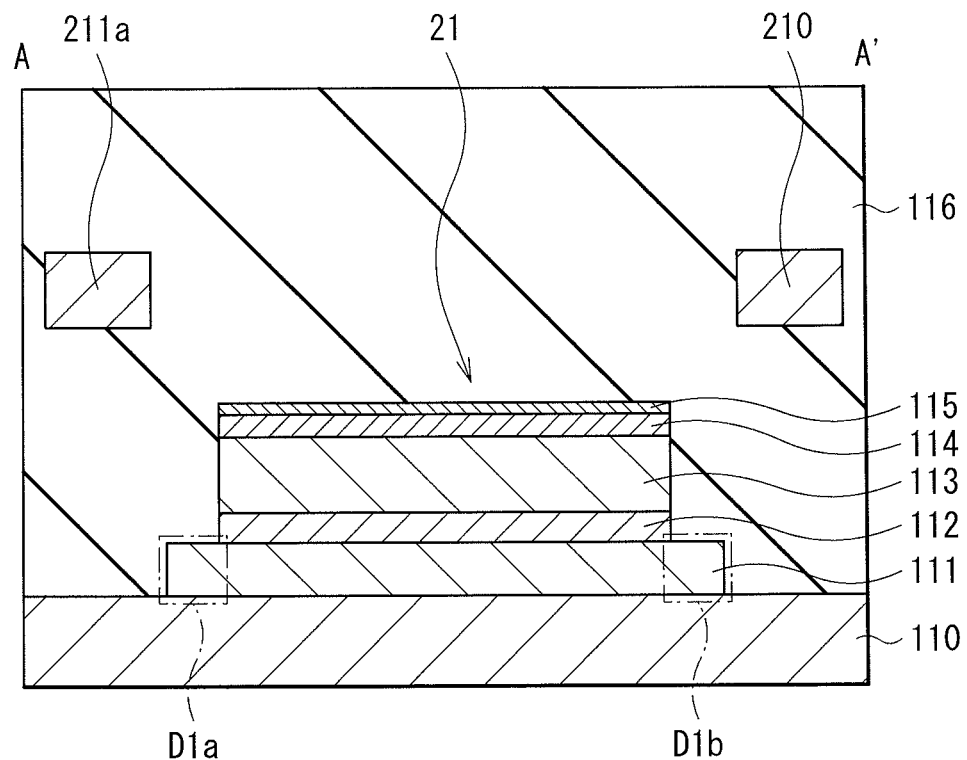
FIG. 5 is a cross-sectional diagram of a region corresponding to a line A-A' of the pixel depicted in FIG. 4.
Figure 6:
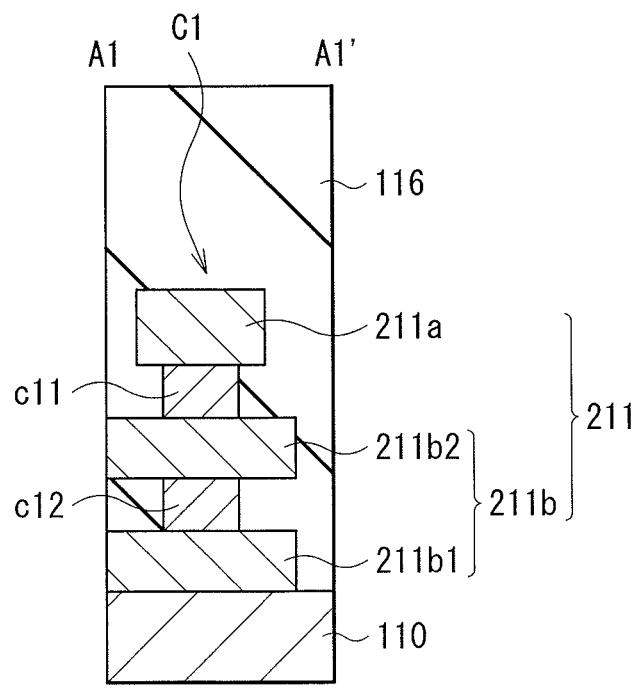
FIG. 6 is a cross-sectional diagram of a region in the neighborhood of a contact section depicted in FIG. 4.

FIG. 4 illustrates a plane configuration example of a main part of the pixel 20. FIG. 5 illustrates a cross-sectional configuration of a region corresponding to a line A-A' of FIG. 4, and FIG. 6 illustrates a cross-sectional configuration of a part in the neighborhood of a contact section (a contact section C1). The photoelectric conversion device 21 and the transistor 22 are arranged in the pixel 20 in this way. In FIG. 4, however, only a lower electrode 111 (a first electrode) is illustrated in a formation region of the photoelectric conversion device 21, and illustration of other components is omitted, for the sake of simplification.

In the photoelectric conversion device 21, for example, the lower electrode 111 may be provide in a selective region on the substrate 110, as illustrated in FIG. 5 and FIG. 6. On this lower electrode 111, an n-type semiconductor layer 112, an i-type semiconductor layer 113, and a p-type semiconductor layer 114 may be laminated in this order. On the p-type semiconductor layer 114, an upper electrode 115 (a second electrode) is disposed. This photoelectric conversion device 21 is covered by an insulating film 116 including an interlayer insulating film, a protective film, etc. It is to be noted that, in the photoelectric conversion device 21 of the present embodiment, a configuration in which the semiconductor layers are provided in order of n-i-p from the lower electrode 111 side is illustrated as an example. However, without being limited to this example, the semiconductor layers may be provided in order of p-i-n from the lower electrode 111 side.

The lower electrode 111 may be made of, for example, a simple substance of any of elements such as molybdenum (Mo), titanium (Ti), and aluminum (Al), or an alloy including two or more of these elements (for example, MoAl etc.). It is to be noted that, here, the lower electrode 111 is connected to the source (or the drain) of the transistor 22, and the signal charge is extracted from this lower electrode 111 side. The drain (the source) of the transistor 22 is connected to a signal line 210 (Lsig) through a contact section C2. However, when the signal charge is extracted from the upper electrode 115 side, this lower electrode 111 may be connected to, for example, a wiring such as a power source wiring for supply of base potential, and the electric charge is released.

The n-type semiconductor layer 112 may include, for instance, a semiconductor material such as amorphous silicon, micro-crystal silicon, and polycrystal silicon (polysilicon), and may be configured using an n-type amorphous silicon, for example. This n-type semiconductor layer 112 has a planar shape (i.e. a plane shape along the surface of the substrate) which is not illustrated in particular, but may be substantially the same as the planar shape of the lower electrode 111.

The i-type semiconductor layer 113 is a non-doped intrinsic semiconductor, and may be configured using, for example, an amorphous silicon. The i-type semiconductor layer 113 may have a thickness of, for example, about 400 nm to about 2,000 nm both inclusive, and the larger the thickness is, the higher the photosensitivity can be. In particular, in the case of the structure in which the n-type semiconductor layer 112, the i-type semiconductor layer 113, and the p-type semiconductor layer 114 are laminated in a vertical direction as in the present embodiment, it is easy to ensure a large thickness of the i-type semiconductor layer 113, as compared with a so-called planar-type structure (a structure in which an i-type semiconductor layer is interposed between a p-type semiconductor layer and an n-type semiconductor layer, along a lateral direction). Therefore, it is possible to improve the photosensitivity, as compared with the planar-type structure.

The p-type semiconductor layer 114 may be configured using, for example, an amorphous silicon, and forms a p+ region. It is to be noted that the i-type semiconductor layer 113 and the p-type semiconductor layer 114 each have a planar shape similar to that of the n-type semiconductor layer 112.

The upper electrode 115 may be, for example, an electrode for release of electric charge, and may be connected to, for example, a wiring such as a power source wiring for supply of base potential. However, when the signal charge is extracted from the upper electrode 115 side, the upper electrode 115 may be electrically connected to the source of the transistor 22, for example. This upper electrode 115 may be configured using, for example, a transparent conductive film made of a material such as ITO (Indium Tin Oxide). It is to be noted that, the planar shape of the upper electrode 115 is not illustrated in particular either, but may be similar to that of the p-type semiconductor layer 114.

The insulating film 116 may be, for example, a laminated film made of one or more kinds of films such as a silicon oxide ($SiO_x$) film, a silicon oxynitride (SiON) film, and a silicon nitride ($SiN_x$) film. Alternatively, the insulating film 116 may be configured using an organic material such as acrylic resin.

(Detailed Configuration of Photoelectric Conversion Device 21 and Readout Control Line 211)

In the image pickup section 11 as describe above, a readout control line 211 (Lread) and the signal line 210 are disposed at a periphery of the photoelectric conversion device 21, in the present embodiment. Specifically, for example, the readout control line 211 may be provided to extend in the H direction, and the signal line 210 may be provided to extend in the V direction, which intersect each other (to form a grid as a whole). The photoelectric conversion device 21 is provided together with the transistor 22, in a region surrounded by the readout control line 211 and the signal line 210.

The readout control line 211 is electrically connected to the gate electrode of the transistor 22, and serves as a wiring provided to supply the control signal that switches the transistor 22 between the ON operation and the OFF operation as described above. In the present embodiment, this readout control line 211 includes a lower wiring layer 211b (a first wiring layer) and an upper wiring layer 211a (a second wiring layer), and the lower wiring layer 211b and the upper wiring layer 211a are laminated in a state of being electrically connected.

The lower wiring layer 211b is a wiring layer provided in the same layer as the gate electrode of the transistor 22. Here, since the transistor 22 has the dual-gate structure as described above, the lower wiring layer 211b includes a gate wiring layer 211b1 (a first gate wiring layer) electrically connected to a lower gate electrode not illustrated, and a gate wiring layer 211b2 (a second gate wiring layer) electrically connected to an upper gate electrode 220. These gate wiring layers 211b1 and 211b2 are electrically connected at the contact section C1. The lower wiring layer 211b may be made of, for example, a material (e.g., molybdenum, etc.) similar to that of each of the gate electrodes of the transistor 22, and may have a width of, for example, about 6 μm to about 8 μm both inclusive. It is to be noted that the lower gate electrode is not illustrated in particular, but is provided in a region facing the upper gate electrode 220, with the semiconductor layers interposed therebetween in FIG. 4.

The upper wiring layer 211a is a wiring layer provided in the same layer as the signal line 210. The upper wiring layer 211a may be configured using, for example, a material (e.g. aluminum, etc.) similar to that of the signal line 210, and may have a width of, for example, about 2.5 μm to about 7 μm both inclusive. The upper wiring layer 211a is electrically connected to the lower wiring layer 211b at the contact section C1. It is to be noted that, desirably, the upper wiring layer 211a may be ensured to have a width of about 6 μm to about 7 μm both inclusive at the contact section C1, but the width in other wiring part may be reduced to about 2.5 μm to about 4 μm both inclusive.

In this way, the readout control line 211 has a wiring connection structure in which the upper wiring layer 211a and the lower wiring layer 211b are laminated, and in at least a part (a region d1) thereof, the lower wiring layer 211b is removed. In other words, the lower wiring layer 211b is divided in the region d1, and the upper wiring layer 211a is provided across the divided lower wiring layer 211b (to link the lower wiring layer 211b). It is to be noted that in the upper wiring layer 211a, resistance is lower than that of the lower wiring layer 211b, and thus it is possible to form a line width narrower than that of the lower wiring layer 211b.

The lower electrode 111 of the photoelectric conversion device 21 is provided in the layer different from the upper wiring layer 211a as described above. Here, the lower electrode 111 is provided in a layer lower than the layer where the upper wiring layer 211a is provided (i.e. a layer between the upper wiring layer 211a and the substrate 110). Specifically, the lower electrode 111 is provided in the same layer as the gate wiring layer 211b1, and may be configured using, for example, the same material as that of the gate wiring layer 211b1.

Further, the lower electrode 111 is provided to protrude towards the readout control line 211 side in the region d1 where the lower wiring layer 211b is removed (i.e. a protruding section D1a is provided). Removal of a part of the lower wiring layer 211b makes it possible to enlarge a formation region of the lower electrode 111 (i.e. to enlarge a formation region of the photoelectric conversion device 21), which is advantageous in making an improvement in fill factor.

Functions and Effects

In the image pickup unit 1 of the present embodiment, when the image pickup light Lin is incident on the image pickup section 11, this image pickup light Lin is converted into signal charge (i.e. subjected to photoelectric conversion) in the photoelectric conversion device 21 in each of the pixels 20. At this moment, in the storage node N, a voltage variation corresponding to a node capacity occurs due to storage of the signal charge generated by the photoelectric conversion. Specifically, when a storage node capacity is assumed to be "Cs" and the generated signal charge is assumed to be "q", the voltage varies (decreases in this case) by (q/Cs) in the storage node N. In response to such a voltage variation, a voltage corresponding to the signal charge is applied to the drain of the transistor 22. Upon the transistor 22 entering the ON state in response to the row scanning signal supplied through the readout control line Lread, the signal charge stored in the storage node N (the voltage corresponding to the signal charge and applied to the drain of the transistor 22) is read from the pixel 20 to the signal line Lsig.

The read signal charge is inputted into the column selecting section 17 in the A/D conversion section 14, for every plurality of (here, four) pixel columns through the signal line Lsig. In the column selecting section 17, for every signal charge inputted through each of the signal lines Lsig, the Q-V conversion (the conversion from the signal charge to the signal voltage) is performed in the charge amplifier circuit 171, and then, the A/D conversion, etc., is performed, thereby generating the output data Dout formed of digital signals (i.e. the image pickup signals). In this way, the output data Dout is sequentially outputted from each of the column selecting sections 17, and transmitted to the outside (or, inputted into an internal memory not illustrated).

Here, in an image pickup unit 1, wiring resistance of a readout control line Lread may lead to a rise in the time constant and an increase in the readout time. Since the readout control line Lread is usually configured using a material (molybdenum etc.) similar to that of a gate electrode of a transistor 22, the wiring resistance easily increases. In particular, when the image pickup unit 1 is large or a high-speed moving image is necessary for a medical application, etc., an improvement thereof is desired.

Therefore, in the present embodiment, in the readout control line 211, the upper wiring layer 211a and the lower wiring layer 211b are laminated, and these layers are electrically connected at the contact section C1. Here, the upper wiring layer 211a is provided in the same layer as the signal line 210 as described above. Thus, the upper wiring layer 211a is configured using a low-resistance material (aluminum etc.) similar to that of the signal line 210, and is relatively low in resistance. Therefore, by adopting the wiring connection structure including the upper wiring layer 211a and the lower wiring layer 211b, the wiring resistance of the readout control line 211 is reduced, and the time constant is decreased.

Comparative Example

Figure 7:
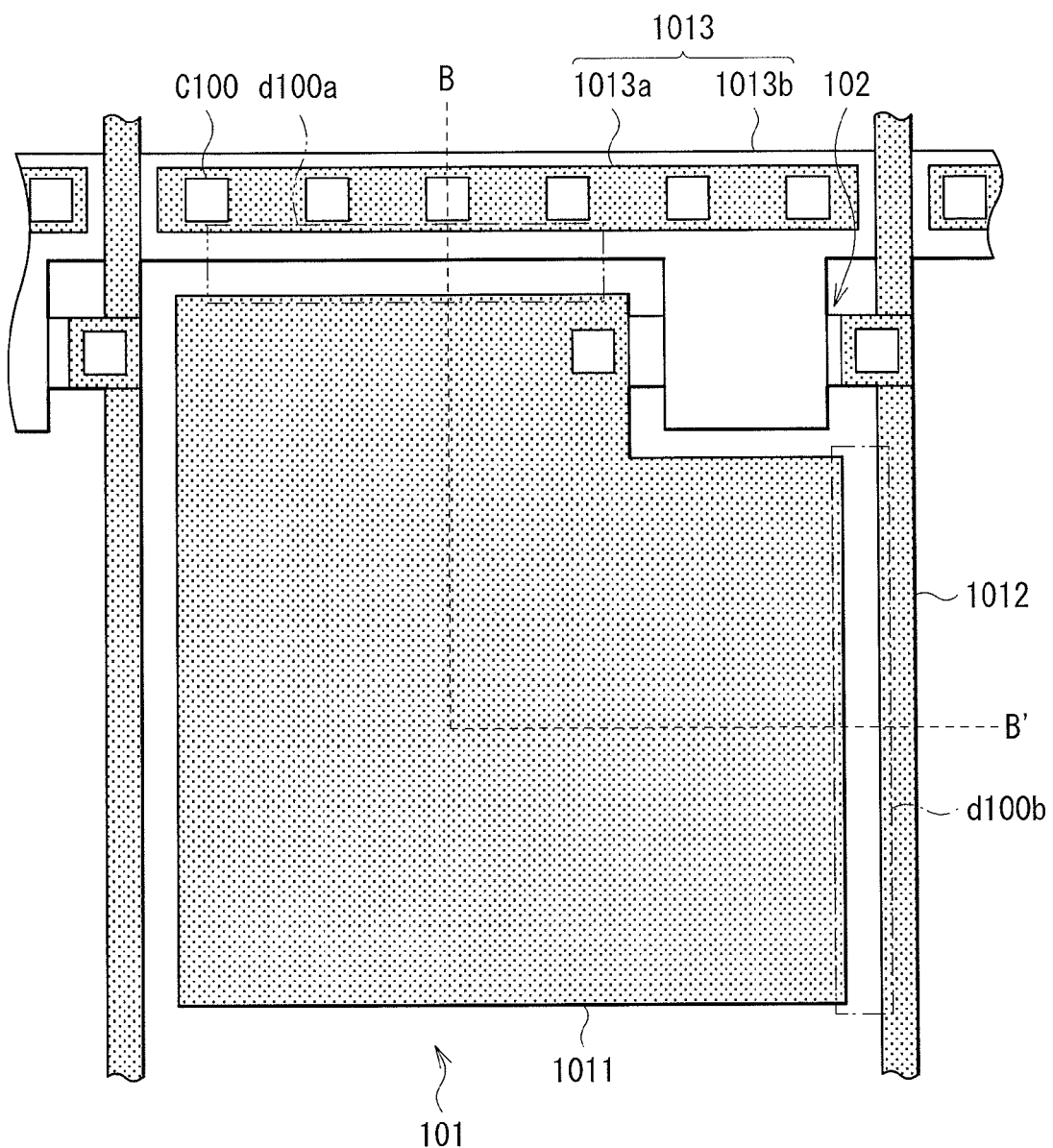
FIG. 7 is a schematic diagram illustrating a plane configuration example of a main part of a pixel according to a comparative example.
Figure 8:
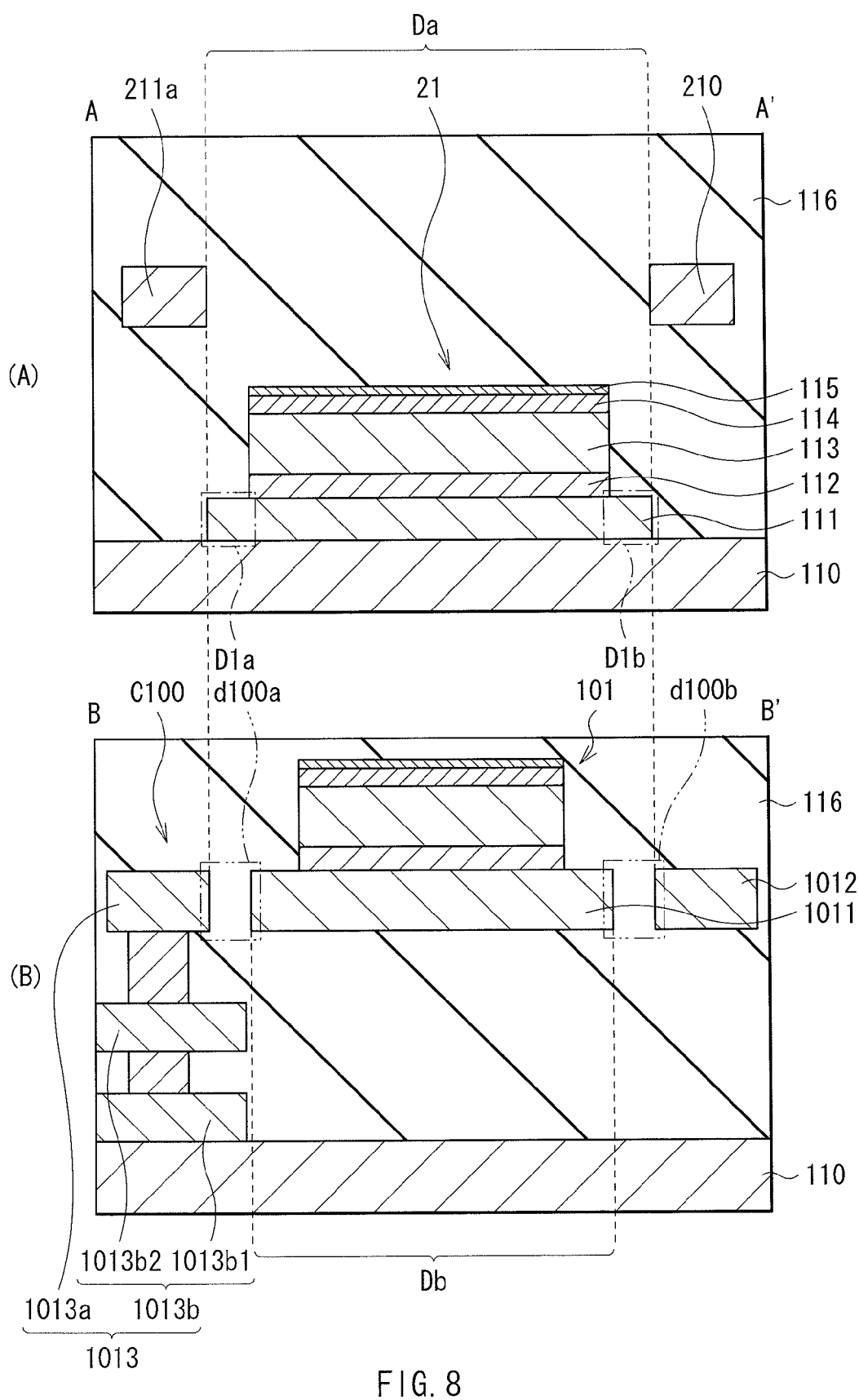
FIG. 8 is a cross-sectional diagram used to explain an effect of an improvement in fill factor.

FIG. 7 illustrates a plane configuration of a main part of a pixel according to a comparative example of the present embodiment. Part (B) of FIG. 8 illustrates a cross-sectional configuration taken along a line B-B' of FIG. 7. In this comparative example, a readout control line 1013 (Lread) is formed such that a lower wiring layer 1013b and an upper wiring layer 1013a are laminated and electrically connected at a contact section C100, in a manner similar to the present embodiment. In addition, the lower wiring layer 1013b is provided in the same layer as a gate electrode (a gate wiring) of a transistor 102, and the upper wiring layer 1013a is provided in the same layer as a signal line 1012. This laminated structure of the upper wiring layer 1013a and the lower wiring layer 1013b makes it possible to obtain an effect (a reduction in wiring resistance) similar to that described above.

However, in this comparative example, a lower electrode 1011 of a photoelectric conversion device 101 is provided in the same layer as the upper wiring layer 1013a and the signal line 1012. Part (A) of FIG. 8 illustrates the cross-sectional configuration of the pixel of the present embodiment, and Part (B) of FIG. 8 illustrates the cross-sectional configuration of the pixel of the comparative example. When the lower electrode 1011 is disposed in the same layer as the upper wiring layer 1013a and the signal line 1012 as illustrated in Part (B) of FIG. 8, capacitive coupling easily occurs in a region d100a between the lower electrode 1011 and the upper wiring layer 1013a as well as a region d100b between the lower electrode 1011 and the signal line 1012. For this reason, it is necessary to secure a predetermined or greater space as each wiring interval in the regions d100a and d100b. Therefore, when the lower electrode 1011 is provided in the same layer as the upper wiring layer 1013a as in the comparative example, a formation region Db of the lower electrode 1011 is reduced just as much as the regions d100a and d100b, which makes it difficult to achieve an excellent fill factor (a light-receiving effective region/pixel region).

Moreover, in this comparative example, the readout control line 1013 is configured such that the lower wiring layer 1013b is not partially removed (divided). For this reason, as illustrated in FIGS. 9A and 9B, for example, capacitive coupling occurs between the lower electrode 1011 and the lower wiring layer 1013b (gate wiring layers 1013b1 and 1013b2), even when the lower electrode 1011 is provided between the upper wiring layer 1013a and a substrate 1011.

In the present embodiment, on the other hand, the lower electrode 111 is provided in the layer different from the upper wiring layer 211a (and the signal line 210) as illustrated in Part (A) of FIG. 8 and FIG. 4. Here, the lower electrode 111 is provided in the same layer as the gate wiring layer 211b1 (not illustrated in Part (A) of FIG. 8) between the upper wiring layer 211a and the substrate 110. Thus, the above-described capacitive coupling is less likely to occur between the lower electrode 111 and the upper wiring layer 211a as well as between the lower electrode 111 and the signal line 210. For this reason, the lower electrode 111 is allowed to be formed over a region Da which is larger than the above-described region Db, and the fill factor is thereby improved.

Further, in the readout control line 211, a part of the lower wiring layer 211b is removed (in the region d1). Since a bridge (a bypass) of the upper wiring layer 211a is formed in the region d1 where the part of the lower wiring layer 211b is removed, it is possible to reduce the width of the readout control line 211 without increasing the wiring resistance. Therefore, the formation region of the lower electrode 111 is allowed to be expanded. For example, a part of the lower electrode 111 may be allowed to protrude towards the readout control line 211 side (i.e. it is possible to form the protruding section D1a). Furthermore, it is possible to expand the formation region of the lower electrode 111 in a region (D1b) along the signal line 210 as well, as compared with the comparative example. This makes it possible to improve the fill factor more effectively.

As described above, in the present embodiment, the lower wiring layer 211b electrically connected to the gate electrode of the transistor 22 and the upper wiring layer 211a arranged in the same layer as the signal line 210 (Lsig) are laminated, in the readout control line 211 (Lread) provided at a periphery of the photoelectric conversion device 21. This makes it possible to lower the wiring resistance and reduce the time constant, as compared with the case in which the readout control line 211 is formed as a single layer. Therefore, it is possible to reduce the readout time, and to take a moving image at a high speed.

Next, modifications (modifications 1 to 7) of the above-described embodiment will be described. It is to be noted that the same components as those of the above-described embodiment will be provided with the same reference numerals as those of the above-described embodiment, and the description thereof will be omitted as appropriate.

[Modification 1]

Figure 10:
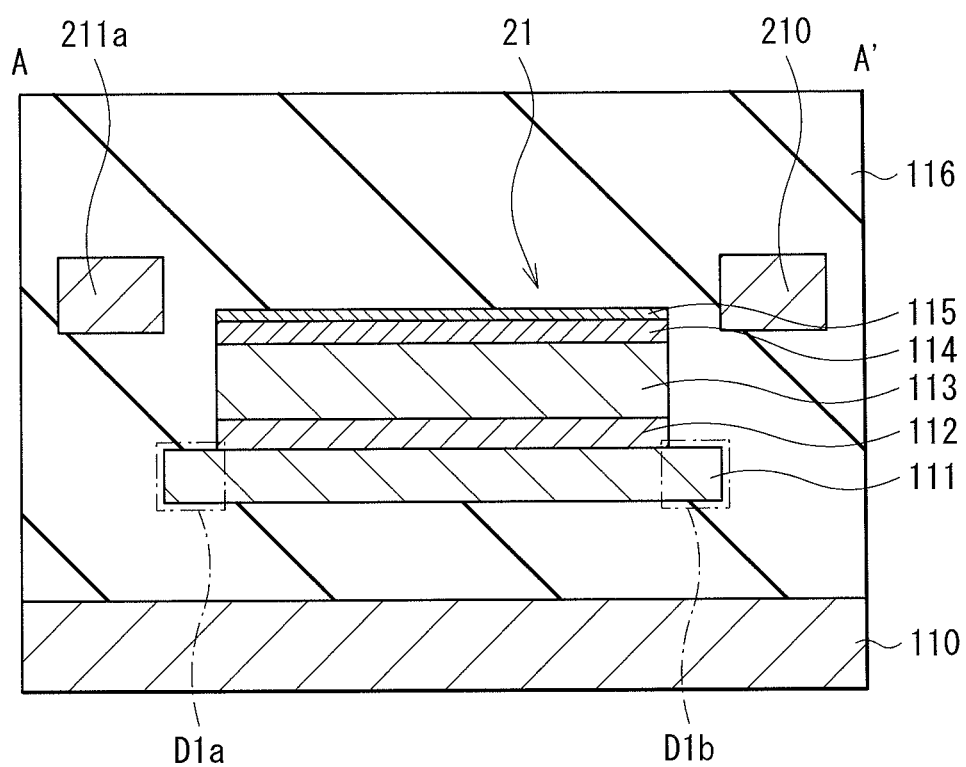
FIG. 10 is a cross-sectional diagram of a pixel according to a modification 1.

FIG. 10 illustrates a cross-sectional configuration of a pixel according to the modification 1. FIG. 10 is equivalent to a cross-sectional diagram taken along the line A-A' of FIG. 4. In the above-described embodiment, the lower electrode 111 is provided in the same layer as the lower gate wiring layer 211b1 of the lower wiring layer 211b. However, the position where the lower electrode 111 is disposed is not limited to this, and may be in any layer different from the upper wiring layer 211a.

For example, the lower electrode 111 may be provided in the same layer as the upper gate wiring layer 211b2 (not illustrated in FIG. 10) of the lower wiring layer 211b, as illustrated in FIG. 10. In this case, it is also possible to reduce the wiring resistance of the readout control line 211, by laminating the upper wiring layer 211a and the lower wiring layer 211b in the readout control line 211 and electrically connecting these layers. In addition, due to removal of a part of the lower wiring layer 211b, capacitive coupling is less likely to occur between the lower electrode 111 and each of the upper wiring layer 211a and the signal line 210. Thus, the formation region of the lower electrode 111 is expanded, thereby allowed the fill factor to be improved. Therefore, it is possible to obtain an effect similar to that of the above-described embodiment.

[Modification 2]

Figure 11:
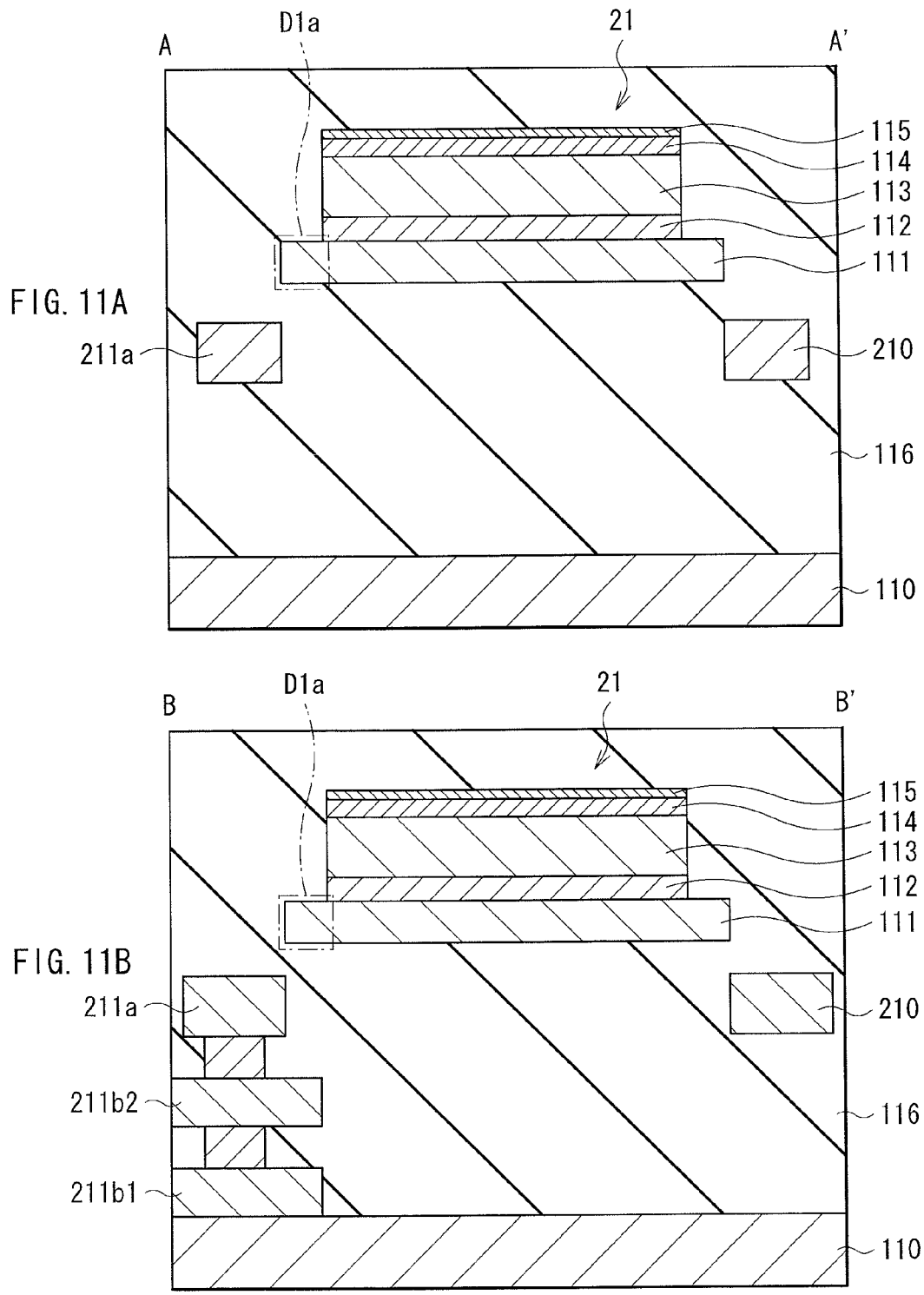
FIGS. 11A and 11B are cross-sectional diagrams of a pixel according to a modification 2.

FIGS. 11A and 11B each illustrate a cross-sectional configuration of a pixel according to the modification 2. Each of these figures is equivalent to a cross-sectional diagram taken along the line A-A' of FIG. 4. As exemplified by the present modification, the lower electrode 111 may be provided in a layer higher than the upper wiring layer 211a. In this case, however, a part of the lower wiring layer 211b may be removed as illustrated in FIG. 11A, or may not be removed as illustrated in FIG. 11B. This is because capacitive coupling is less likely to occur between the lower electrode 111 and the lower wiring layer 211b.

[Modification 3]

Figure 12:
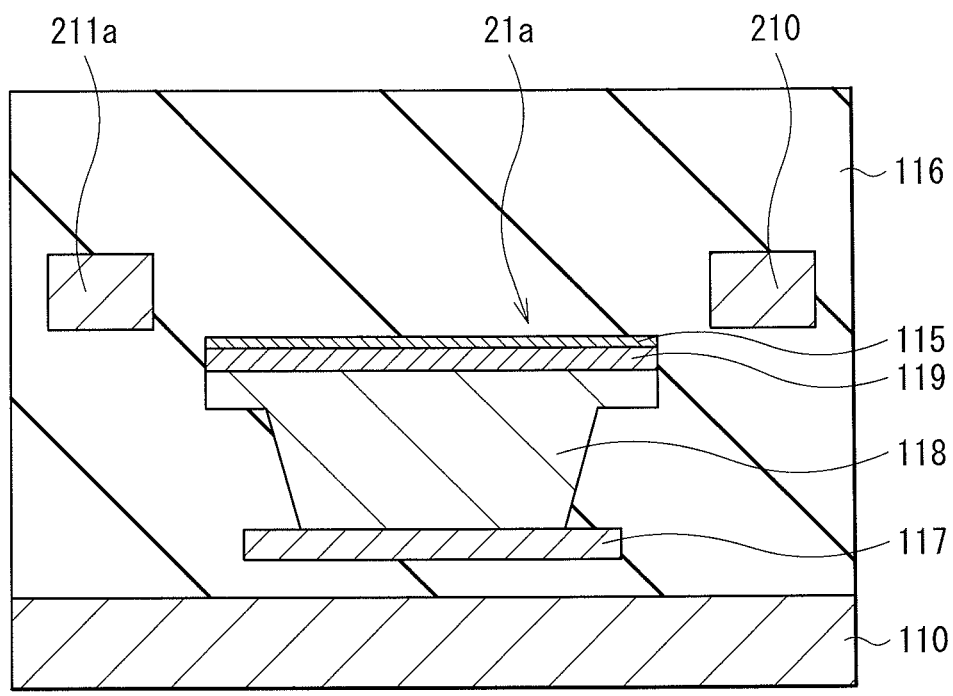
FIG. 12 is a cross-sectional diagram of a pixel according to a modification 3.

FIG. 12 illustrates a cross-sectional configuration of a pixel according to the modification 3. In the above-described embodiment, etc., the structure in which the n-type semiconductor layer 112, the i-type semiconductor layer 113, and the p-type semiconductor layer 114 are laminated between the lower electrode 111 and the upper electrode 115 has been described as an example of the photoelectric conversion device 21. However, among these, the lower electrode 111 may not be formed. For example, a device (a photoelectric conversion device 21a) in which the lower electrode 111 is unnecessary may be formed using a low-temperature polycrystal silicon for an n-type semiconductor layer 117. Specifically, in the photoelectric conversion device 21a, the n-type semiconductor layer 117 is provided above a selective region on the substrate 110 with the insulating film 116 interposed therebetween. On this n-type semiconductor layer 117, the i-type semiconductor layer 113, the p-type semiconductor layer 114, and the upper electrode 115 are laminated in this order. When the low-temperature polycrystal silicon is used for the n-type semiconductor layer 117 as described above, the n-type semiconductor layer 117 is of low resistance and thus, the lower electrode 111 is unnecessary. It is possible to obtain an effect equivalent to that of the above-described embodiment, in this case as well.

[Modification 4-1]

Figure 13:
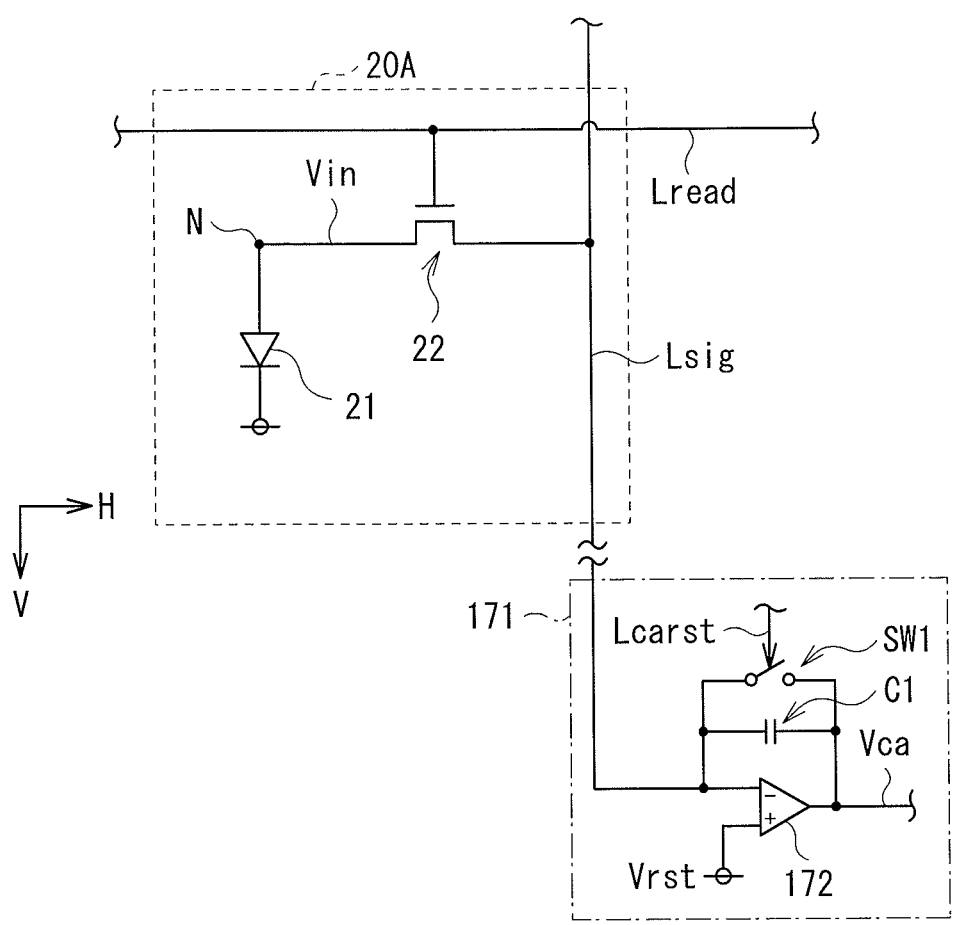
FIG. 13 is a circuit diagram illustrating a configuration of a pixel etc. according to a modification 4-1.

FIG. 13 illustrates a circuit configuration of a pixel (a pixel 20A) according to the modification 4-1, together with the circuit configuration example of the charge amplifier circuit 171. As with the pixel 20 of the above-described embodiment, the pixel 20A includes a so-called passive pixel circuit, and includes the one photoelectric conversion device 21 and the one transistor 22. In addition, the readout control line Lread and the signal line Lsig are connected to this pixel 20A.

However, in the pixel 20A of this modification, unlike the pixel 20 of the above-described embodiment, the anode of the photoelectric conversion device 21 is connected to the storage node N, and the cathode of the photoelectric conversion device 21 is connected to a power source. In this way, in the pixel 20A, the storage node N may be connected to the anode of the photoelectric conversion device 21. Even in this case, effects similar to those of the image pickup unit 1 of the above-described embodiment are achievable.

[Modification 4-2]

Figure 14:
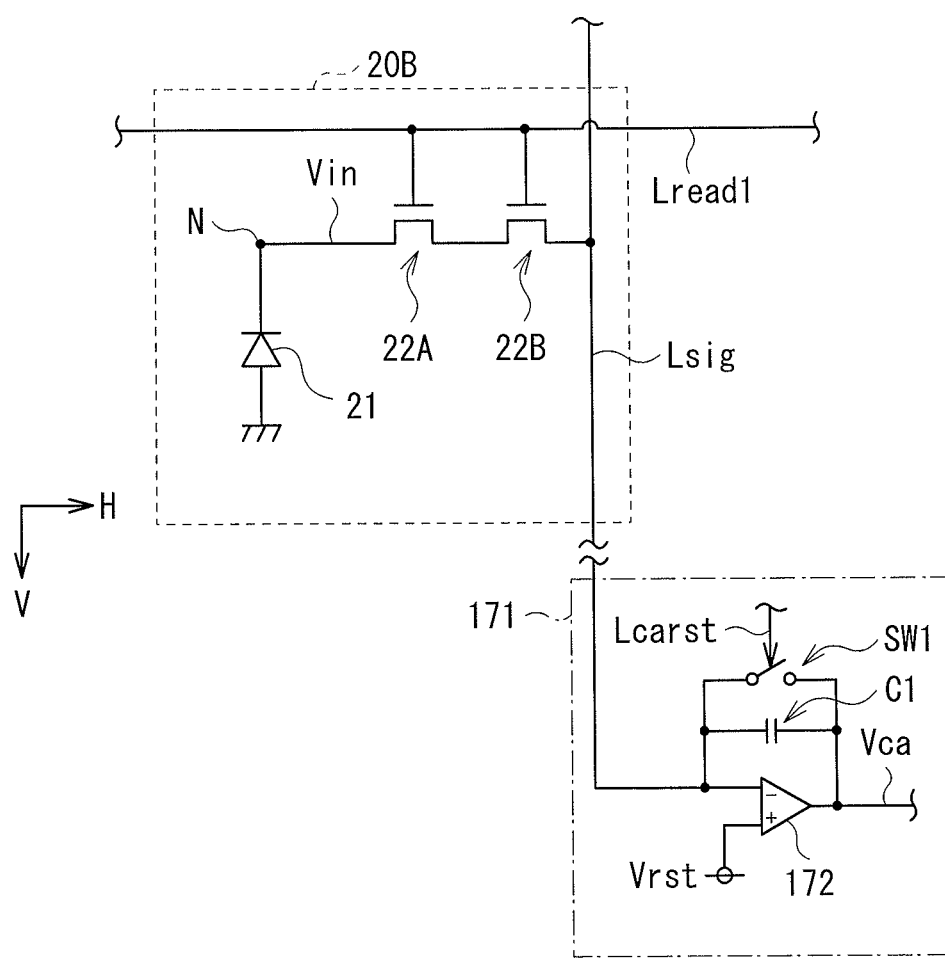
FIG. 14 is a circuit diagram illustrating a configuration of a pixel etc. according to a modification 4-2.

FIG. 14 illustrates a circuit configuration of a pixel (a pixel 20B) according to the modification 4-2, together with the circuit configuration example of the charge amplifier circuit 171. As with the pixel 20 of the above-described embodiment, this pixel 20B has a so-called passive circuit configuration and is connected to the readout control line Lread and the signal line Lsig.

In this modification, however, the pixel 20B includes two transistors 22A and 22B in addition to one photoelectric conversion device 21. These two transistors 22A and 22B are connected in series to each other (i.e. a source or a drain of one of the transistors 22A and 22B is electrically connected to a source or a drain of the other). Further, a gate in each of the transistors 22A and 22B is connected to the readout control line Lread.

In this way, a configuration in which the pixel 20B is provided with the two transistors 22A and 22B connected in series may be adopted. Even in this case, effects similar to those of the above-described embodiment are achievable.

[Modifications 4-3 and 4-4]

Figure 15:
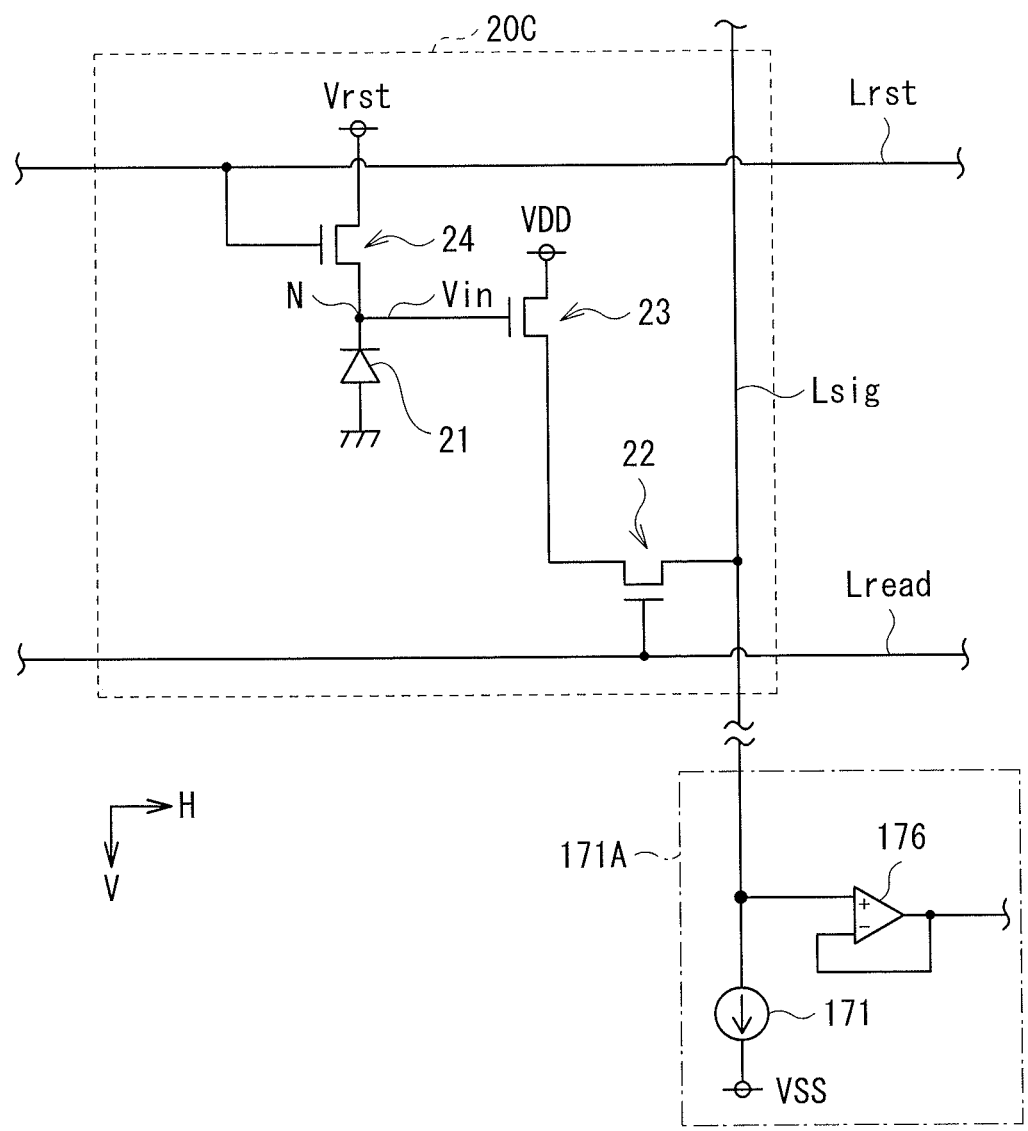
FIG. 15 is a circuit diagram illustrating a configuration of a pixel etc. according to a modification 4-3.
Figure 16:
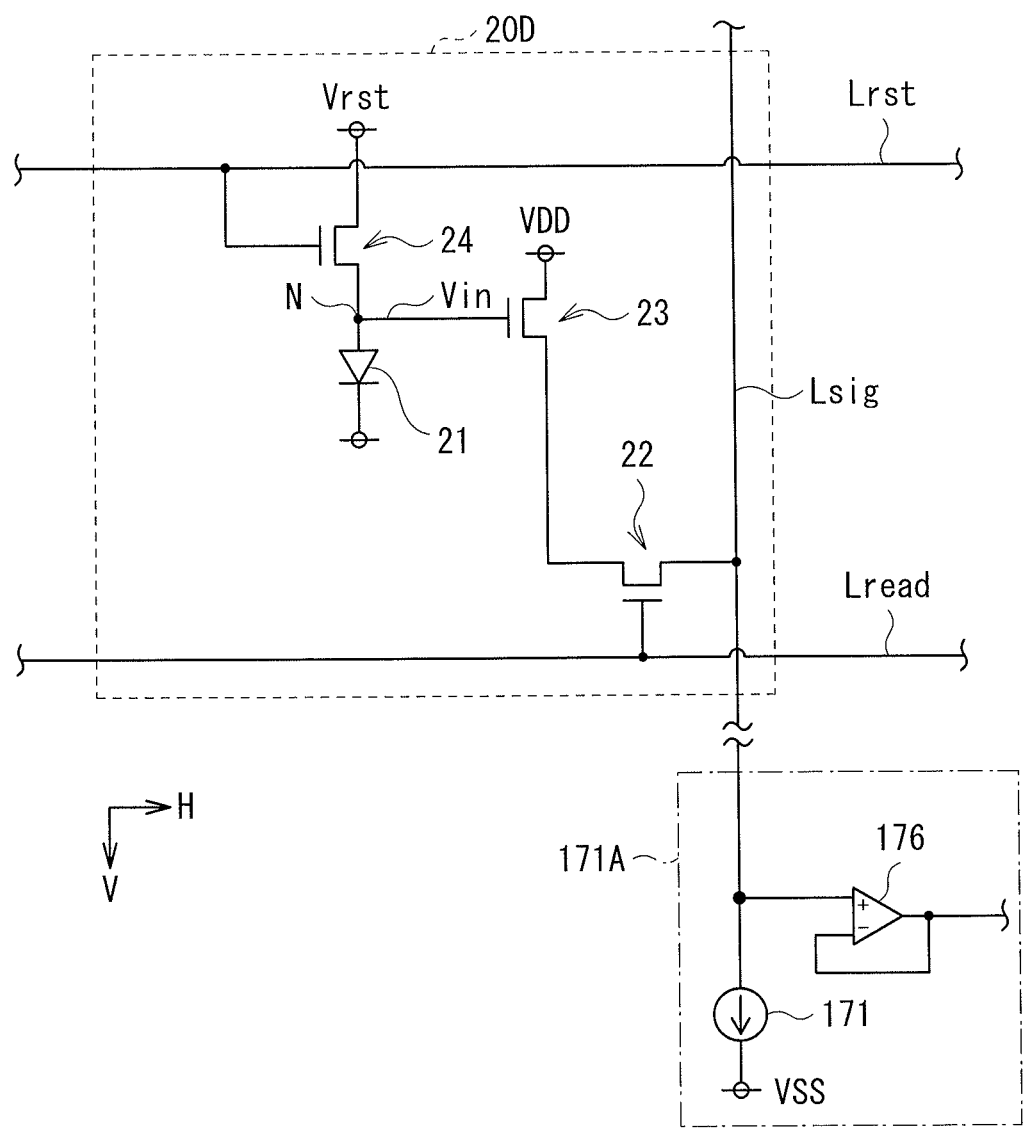
FIG. 16 is a circuit diagram illustrating a configuration of a pixel etc. according to a modification 4-4.

FIG. 15 illustrates a circuit configuration of a pixel (a pixel 20C) according to the modification 4-3, together with a circuit configuration example of an amplifier circuit 171A. FIG. 16 illustrates a circuit configuration of a pixel (a pixel 20D) according to the modification 4-4, together with the circuit configuration example of the amplifier circuit 171A. These pixels 20C and 20D each includes a so-called active pixel circuit, unlike the pixels 20, 20A, and 20B described above.

The pixel 20C or 20D is provided with the one photoelectric conversion device 21, and three transistors 22, 23, and 24. In addition to the readout control line Lread and the signal line Lsig, a reset control line Lrst is connected to the pixel 20C or 20D.

In the pixel 20C or 20D, the gate of the transistor 22 is connected to the readout control line Lread, the source may be connected to, for example, the signal line Lsig, and the drain may be connected to, for example, a drain of the transistor 23 that forms a source follower circuit. A source of the transistor 23 may be connected to, for example, a power source VDD. A gate of the transistor 23 may be connected to, for example, the cathode (in the modification in FIG. 15) or the anode (in the modification in FIG. 16) of the photoelectric conversion device 21, and also to a drain of the transistor 24 that functions as a reset transistor, through the storage node N. A gate of the transistor 24 is connected to the reset control line Lrst, and, for example, the reset voltage Vrst may be applied to a source thereof. In the modification 4-3 of FIG. 15, the anode of the photoelectric conversion device 21 is connected to the ground (grounded), and in the modification 4-4 of FIG. 16, the cathode of the photoelectric conversion device 21 is connected to the power source.

The amplifier circuit 171A is a circuit in which, in the column selecting section 17 described above, a constant current source 171 and an amplifier 176 are provided in place of the charge amplifier 172, the capacitive device C1, and the switch SW1. In the amplifier 176, the signal line Lsig is connected to an input terminal on the positive side and an input terminal on the negative side and an output terminal are connected to each other, thereby forming a voltage follower circuit. It is to be noted that one terminal of the constant current source 171 is connected to one end of the signal line Lsig, and a power source VSS is connected to the other terminal of this constant current source 171.

An image pickup unit having such active pixel 20C or 20D also achieves effects similar to those of the above-described embodiment.

[Modification 5-1]

Figure 17A:
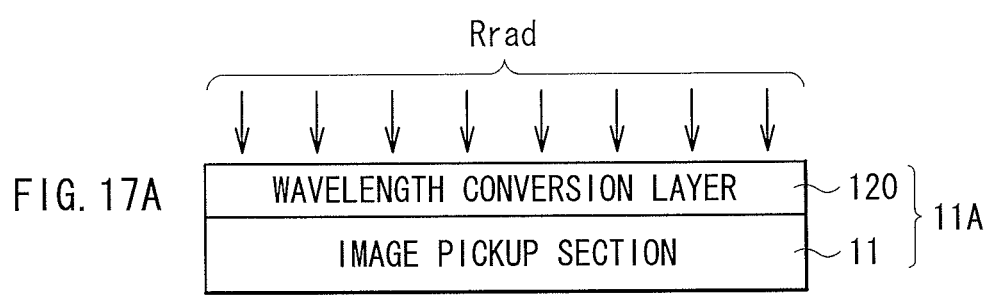
FIGS. 17A and 17B are a cross-sectional diagram of a pixel according to a modification 5-1 and that according to a modification 5-2, respectively.

FIG. 17A illustrates a schematic configuration of an image pickup section (an image pickup section 11A) according to the modification 5-1. In this modification, a wavelength conversion layer 120 is further provided on the photoelectric conversion layer 111 (on the insulating film 116). The wavelength conversion layer 120 converts the wavelengths of radiation rays Rrad (for example, alpha rays, beta rays, gamma rays, X-rays, etc.) into those in a sensitivity range of the photoelectric conversion device 21. This enables reading of information based on the radiation rays Rrad, in the photoelectric conversion device 21. The wavelength conversion layer 120 may be made of a phosphor substance (for example, a scintillator) that converts, for example, radiation rays such as X-rays into visible light. The wavelength conversion layer 120 described above may be obtained by, for example, forming a planarizing film made of a material such as an organic material and a spin-on-glass material on the insulating film 116, and then forming a phosphor film (such as CsI, NaI, and $CaF_2$), for example, on the planarizing film. This pixel configuration may be applied to, for example, a so-called indirect radiation image-pickup unit.

[Modification 5-2]

Figure 17B:
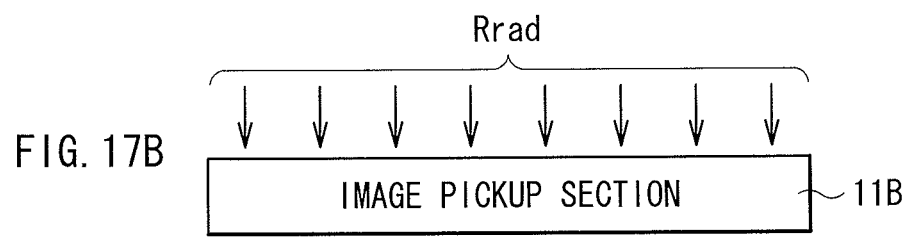

FIG. 17B illustrates a schematic configuration of an image pickup section (an image pickup section 11B) according to the modification 5-2. The image pickup section 11B includes a photoelectric conversion device that converts the incident radiation rays Rrad into electric signals, unlike the above-described embodiment, etc. Such a photoelectric conversion device may be configured using a material such as an amorphous selenium (a-Se) semiconductor and a cadmium tellurium (CdTe) semiconductor. This image pickup section 11B may be applied to, for example, a so-called direct radiation image-pickup unit.

The image pickup unit with the image pickup section according to each of the modifications 5-1 and 5-2 may be used as any of various types of radiation image-pickup units which obtain electric signals based on the incident radiation rays Rrad. The image pickup unit may be applied to, for example, medical X-ray image-pickup units (such as Digital Radiography), belongings inspection X-ray image-pickup units used at airports, etc., industrial X-ray image-pickup units (such as inspection units used to check dangerous objects, etc., in containers and inspection units used to check objects in bags, etc.), and so forth.

Application Example

The image pickup unit according to each of the embodiments and the modifications may be applied to an image pickup display system described below.

Figure 18:
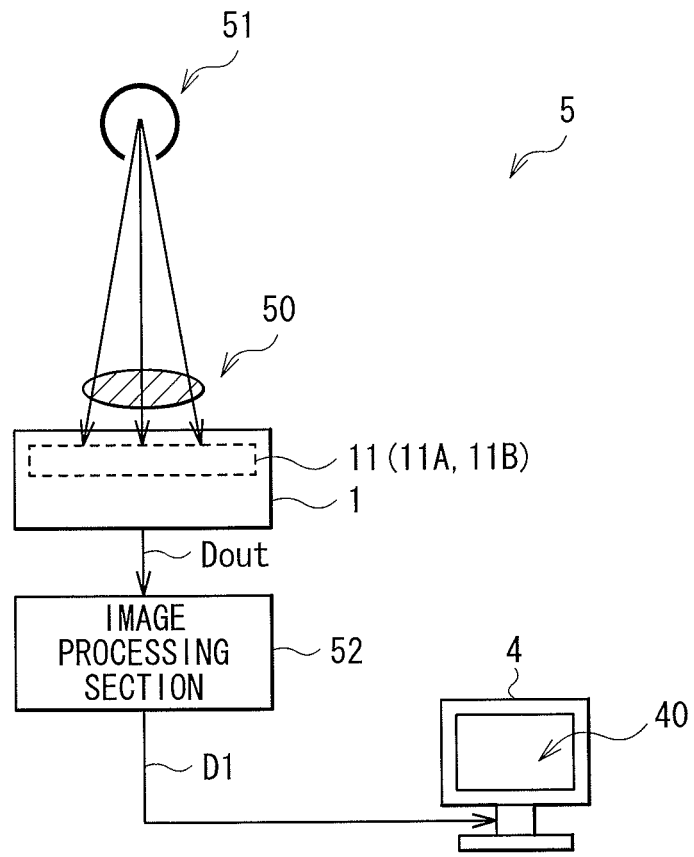
FIG. 18 is a schematic diagram illustrating a schematic configuration of an image pickup display system according to an application example.

FIG. 18 illustrates a schematic configuration example of an image pickup display system (an image pickup display system 5) according to an application example. The image pickup display system 5 includes the image pickup unit 1 having the image pickup section 11 (or the image pickup section 11A) according to any of the embodiments, etc. The image pickup display system 5 further includes an image processing section 52, and a display unit 4. In this example, the image pickup display system 5 is configured as an image pickup display system using a radiation ray (i.e. a radiation image pickup display system).

The image processing section 52 generates image data D1 by subjecting the output data Dout (the image pickup signals) outputted from the image pickup unit 1, to predetermined image processing. The display unit 4 displays an image based on the image data D1 generated by the image processing section 52, on a predetermined monitor screen 40.

In this image pickup display system 5, the image pickup unit 1 (here, the radiation image-pickup unit) acquires image data Dout of a subject 50, based on irradiation light (here, the radiation ray) emitted to the subject 50 from a light source (here, a radiation source such as an X-ray source) 51. The image pickup unit 1 then outputs the acquired image data Dout to the image processing section 52. The image processing section 52 subjects the inputted image data Dout to the above-mentioned predetermined image processing, and then outputs the image data (display data) D1 after the image processing to the display unit 4. The display unit 4 displays image information (a picked-up image) on the monitor screen 40, based on the inputted image data D1.

In this way, in the image pickup display system 5 of this application example, the image of the subject 50 is allowed to be acquired as electric signals in the image pickup unit 1. Therefore, image display is enabled by transmission of the acquired electric signals to the display unit 4. In other words, the image of the subject 50 is allowed to be observed without using a radiographic film usually used, and further, photography and display of a moving image are also possible.

It is to be noted that this application example has been described using the case where the image pickup unit 1 is configured as the radiation image-pickup unit, and the image pickup display system is configured to use the radiation ray. However, the image pickup display system of any embodiment of the disclosure is also applicable to systems using other types of image pickup units.

Figure 19:
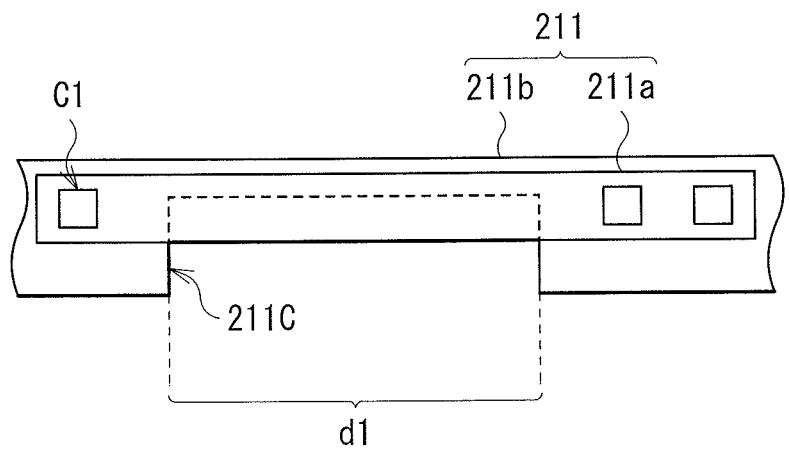
FIG. 19 is a plane schematic diagram illustrating another example of a readout control line.

The disclosure has been described with reference to the embodiment, the modifications, and the application example, but is not limited thereto and may be variously modified. For example, in the above-described embodiment, etc., the configuration in which the lower wiring layer 211b is partially divided in the readout control line 211 has been taken as an example, but the lower wiring layer 211b may not be completely cut in part. For example, as illustrated in FIG. 19, a part (the region d1) of the lower wiring layer 211b may be notched (a notch 211c is formed) in the readout control line 211, and the upper wiring layer 211a may be disposed to cover at least a part of this notch 211c.

Further, in the above-described embodiment, etc., the circuit configuration of the pixel in the image pickup section may be other circuit configuration, without being limited to that described with reference to each of the embodiment, etc. (for example, the circuit configurations of the pixels 20, and 20A to 20D). Similarly, the circuit configuration of each of the row scanning section, the column selecting section, etc., may be other circuit configuration, without being limited to that described with reference to each of the embodiment, etc.

Furthermore, each of the image pickup section, the row scanning section, the A/D conversion section (the column selecting section), the column scanning section, etc., described in the embodiment, etc., may be formed on the same substrate, for example. Specifically, switches, etc., in these circuit parts may be formed on the same substrate, by using, for instance, a polycrystalline semiconductor such as low-temperature polycrystal silicon. This makes it possible to, for example, perform driving operation on the same substrate based on a control signal from an external system control section, thereby allowing for reduction in size of a bezel (a frame structure of three free sides) and improvement in reliability in wiring connection.

Furthermore, the technology encompasses any possible combination of some or all of the various embodiments and the modifications described herein and incorporated herein.

Accordingly, it is possible to achieve at least the following configurations from the above-described example embodiments and the modifications of the disclosure.

(1) An image pickup section with a pixel, the pixel comprising:
a photo electric conversion device configured to receive incident light and generate an electric charge corresponding to the incident light,
a transistor, and
a readout control line and a signal line at outside the periphery of the transistor and connected to the transistor,
wherein,
the readout control line includes a first wiring layer electrically connected to a second wiring layer, and
the second wiring layer is in the same layer as the signal line.

(2) The image pickup section according to (1) wherein the first wiring layer and second wiring layer are laminated.

(3) The image pickup section according to (2) wherein the second wiring layer is divided into at least two sections and the first wiring layer extends across each section of the second wiring layer.

(4) The image pickup section according to (1) wherein the photoelectric conversion device is configured to receive incident light and generate an electric charge corresponding to the incident light.

(5) The image pickup section according to (1) wherein a portion of the first wiring layer is removed.

(6) The image pickup section according to (1) wherein the photoelectric conversion device comprises a first type semiconductor layer, an intrinsic semiconductor layer, and a second type semiconductor layer.

(7) The image pickup section according to (6) wherein the first type semiconductor layer comprises at least one of a low temperature poly-silicon, an amorphous silicon, and a micro-crystal silicon.

(8) An image pickup display system comprising:
an image pickup unit; and
a display unit configured to display an image pickup signal received from the image pickup unit,
wherein,
the image pickup unit comprises (a) an image pickup section including a plurality of pixels arranged in a matrix, (b) a row scanning section, (c) an A/D conversion section, (d) a column scanning section, and (e) a system control section configured to control the row scanning section, the A/D conversion section and the column scanning section,
each pixel includes (a) a photo electric conversion device configured to receive incident light and generate an electric charge corresponding to the incident light, (b) a transistor, and (c) a readout control line and a signal line at outside the periphery of the transistor and connected to the transistor,
the readout control line includes a first wiring layer electrically connected to a second wiring layer, and
the second wiring layer is in the same layer as the signal line.

(9) The image pickup display system according to (8) wherein the photoelectric conversion device is configured to receive incident light and generate an electric charge corresponding to the incident light.

(10) The image pickup display system according to (8) wherein the image pickup section further comprises a wavelength conversion layer configured to convert a wavelength of a radiation ray into a wavelength in a sensitivity range of the photoelectric conversion device.

(11) The image pickup unit according to (10) wherein the wavelength conversion layer is configured to convert an X-ray wavelength into a sensitivity range of the photoelectric conversion device.

(12) An image pickup unit, including:
a plurality of pixels each including a photoelectric conversion device and a field-effect transistor; and
a readout control line and a signal line that are disposed in a peripheral region of the photoelectric conversion device and are connected to the transistor, the readout control line including a first wiring layer and a second wiring layer that are laminated and are electrically connected to each other, the first wiring layer being electrically connected to a gate electrode of the transistor, and the second wiring layer being provided in a same layer as the signal line.

(13) The image pickup unit according to (12), wherein at least a part of the first wiring layer is removed.

(14) The image pickup unit according to (13), wherein
the photoelectric conversion device includes a first electrode, a first-conductivity type semiconductor layer, an intrinsic semiconductor layer, a second-conductivity type semiconductor layer, and a second electrode that are provided in this order on a substrate, and
the first electrode is provided in a layer different from the layer in which the second wiring layer of the readout control line is provided.

(15) The image pickup unit according to (13) or (14), wherein the first electrode is provided to protrude towards the readout control line, in a region in which the first wiring layer is removed.

(16) The image pickup unit according to (14) or (15), wherein the first electrode is provided in the layer that is located between the second wiring layer and the substrate.

(17) The image pickup unit according to (16), wherein
the transistor includes a first gate electrode, a semiconductor layer, and a second gate electrode that are provided in this order from the substrate, and
the first wiring layer includes a first gate wiring layer and a second gate wiring layer, the first gate wiring layer being provided in a same layer as the first gate electrode, and the second gate wiring layer being provided in a same layer as the second gate electrode.

(18) The image pickup unit according to (17), wherein the first electrode is provided in the same layer as the first gate wiring layer.

(19) The image pickup unit according to (17), wherein the first electrode is provided in the same layer as the second gate wiring layer.

(20) The image pickup unit according to (14) or (15), wherein the first electrode is provided in the layer that is located on a side, of the second wiring layer, opposite to the substrate.

(21) The image pickup unit according to any one of (14) to (20), wherein the first-conductivity type semiconductor layer includes one of an amorphous silicon, a micro-crystal silicon, and a polycrystal silicon.

(22) The image pickup unit according to (13), wherein
the photoelectric conversion device includes a first-conductivity type semiconductor layer, an intrinsic semiconductor layer, a second-conductivity type semiconductor layer, and a second electrode that are provided in this order on a substrate, and
the first-conductivity type semiconductor layer is provided in a layer different from the layer in which the second wiring layer of the readout control line is provided.

(23) The image pickup unit according to (22), wherein the first-conductivity type semiconductor layer includes a low-temperature polycrystal silicon.

(24) The image pickup unit according to any one of (12) to (23), further including a wavelength conversion layer provided on the photoelectric conversion device, the wavelength conversion layer converting a wavelength of a radiation ray into a wavelength in a sensitivity range of the photoelectric conversion device.
(25) The image pickup unit according to any one of (12) to (24), wherein the photoelectric conversion device generates an electric signal based on an incident radiation ray.
(26) The image pickup unit according to (24) or (25), wherein the radiation ray is an X-ray.
(27) An image pickup display system with an image pickup unit and a display unit that performs image display based on an image pickup signal obtained by the image pickup unit, the image pickup unit including:
a plurality of pixels each including a photoelectric conversion device and a field-effect transistor; and
a readout control line and a signal line that are disposed in a peripheral region of the photoelectric conversion device and are connected to the transistor, the readout control line including a first wiring layer and a second wiring layer that are laminated and are electrically connected to each other, the first wiring layer being electrically connected to a gate electrode of the transistor, and the second wiring layer being provided in a same layer as the signal line.

The disclosure contains subject matter related to that disclosed in Japanese Priority Patent Application JP 2012-133858 filed in the Japan Patent Office on Jun. 13, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup section with a pixel, the pixel comprising:
a photo electric conversion device configured to receive incident light and generate an electric charge corresponding to the incident light,
a transistor, and
a readout control line and a signal line at outside the periphery of the transistor and connected to the transistor, wherein,
the readout control line includes a first wiring layer electrically connected to a second wiring layer, and
the second wiring layer is in the same layer as the signal line.

2. The image pickup section according to claim 1 wherein the first wiring layer and second wiring layer are laminated.

3. The image pickup section according to claim 2 wherein the second wiring layer is divided into at least two sections and the first wiring layer extends across each section of the second wiring layer.

4. The image pickup section according to claim 1 wherein the photoelectric conversion device is configured to receive incident light and generate an electric charge corresponding to the incident light.

5. The image pickup section according to claim 1 wherein a portion of the first wiring layer is removed.

6. The image pickup section according to claim 1 wherein the photoelectric conversion device comprises a first type semiconductor layer, an intrinsic semiconductor layer, and a second type semiconductor layer.

7. The image pickup section according to claim 6 wherein the first type semiconductor layer comprises at least one of a low temperature poly-silicon, an amorphous silicon, and a micro-crystal silicon.

8. An image pickup display system comprising:
an image pickup unit; and
a display unit configured to display an image pickup signal received from the image pickup unit,
wherein,
the image pickup unit comprises (a) an image pickup section including a plurality of pixels arranged in a matrix, (b) a row scanning section, (c) an A/D conversion section, (d) a column scanning section, and (e) a system control section configured to control the row scanning section, the A/D conversion section and the column scanning section,
each pixel includes (a) a photo electric conversion device configured to receive incident light and generate an electric charge corresponding to the incident light, (b) a transistor, and (c) a readout control line and a signal line at outside the periphery of the transistor and connected to the transistor,
the readout control line includes a first wiring layer electrically connected to a second wiring layer, and
the second wiring layer is in the same layer as the signal line.

9. The image pickup display system according to claim 8 wherein the photoelectric conversion device is configured to receive incident light and generate an electric charge corresponding to the incident light.

10. The image pickup display system according to claim 8 wherein the image pickup section further comprises a wavelength conversion layer configured to convert a wavelength of a radiation ray into a wavelength in a sensitivity range of the photoelectric conversion device.

11. The image pickup unit according to claim 10 wherein the wavelength conversion layer is configured to convert an X-ray wavelength into a sensitivity range of the photoelectric conversion device.

* * * * *